United States Patent
Ye et al.

(10) Patent No.: US 10,431,374 B2
(45) Date of Patent: Oct. 1, 2019

(54) MANUFACTURING METHOD OF A FILTER STRUCTURE

(71) Applicant: Guangdong MISUN Technology Co., Ltd, Dongguan, Guangdong (CN)

(72) Inventors: Chengke Ye, Guangdong (CN); Xingqun Wen, Guangdong (CN)

(73) Assignee: Guangdong MISUN Technology Co., Ltd, Dongguan (CN)

( * ) Notice: Subject to any disclaimer, the term of this patent is extended or adjusted under 35 U.S.C. 154(b) by 130 days.

(21) Appl. No.: 15/683,777

(22) Filed: Aug. 22, 2017

(65) Prior Publication Data

US 2018/0247756 A1    Aug. 30, 2018

(30) Foreign Application Priority Data

Feb. 24, 2017    (CN) .......................... 2017 1 0103487

(51) Int. Cl.
| H01F 7/06 | (2006.01) |
| H01F 27/30 | (2006.01) |
| H01R 43/02 | (2006.01) |
| H01F 27/28 | (2006.01) |
| H01F 27/29 | (2006.01) |

(Continued)

(52) U.S. Cl.
CPC .......... *H01F 27/306* (2013.01); *B23K 11/004* (2013.01); *B23K 11/11* (2013.01); *B23K 11/16* (2013.01); *B23K 37/0443* (2013.01); *H01F 17/062* (2013.01); *H01F 27/2828* (2013.01); *H01F 27/29* (2013.01); *H01L 24/85* (2013.01); *H01R 43/02* (2013.01); *B23K 2101/32* (2018.08); *B23K 2101/36* (2018.08); *B23K 2101/38* (2018.08); *H01F 27/04* (2013.01); *H01F 41/10* (2013.01); *H01F 41/32* (2013.01); *H01R 43/0214* (2013.01)

(58) Field of Classification Search
CPC .... H01F 27/306; H01F 27/2828; H01F 27/29; H01F 27/04; H01F 41/32; H01F 41/10; H01F 17/062; B23K 11/004; B23K 11/11; B23K 11/16; B23K 37/0443; H01L 24/85; H01R 43/0214
See application file for complete search history.

(56) References Cited

U.S. PATENT DOCUMENTS

| 5,656,985 A * | 8/1997 | Lu .......................... H01F 27/027 174/561 |
| 6,320,489 B1 * | 11/2001 | Lu .......................... H01F 27/027 336/192 |

(Continued)

*Primary Examiner* — Paul D Kim

(57) ABSTRACT

Disclosed are a filter structure, a welding fixture, and a manufacturing method of the filter structure. The filter structure includes: a box having a cavity; coil components installed in the cavity; and wiring components, each having a positive wiring pin and a negative wiring pin fixed to the box. The conductive wire has conductive wires coupled to both ends of the coil component and welded with the positive and negative wiring pins respectively. After a wiring section of the pins is embedded into a side of a wire latch slot, the conductive wire of the coil is latched into the wire latch slot and welded with the pins by spot welding without the need of manually winding the conductive wire and the pins, so as to reduce labor, expedite assembling, improve production efficiency and save material cost of the conductive wire.

2 Claims, 4 Drawing Sheets

(51) Int. Cl.
*H01L 23/00* (2006.01)
*B23K 11/00* (2006.01)
*B23K 11/11* (2006.01)
*B23K 11/16* (2006.01)
*B23K 37/04* (2006.01)
*H01F 17/06* (2006.01)
H01F 27/04 (2006.01)
H01F 41/32 (2006.01)
H01F 41/10 (2006.01)
B23K 101/32 (2006.01)
B23K 101/36 (2006.01)
B23K 101/38 (2006.01)

(56) References Cited

U.S. PATENT DOCUMENTS

| | | | | |
|---|---|---|---|---|
| 6,662,431 | B1* | 12/2003 | Lu | H01F 27/027 29/602.1 |
| 9,881,725 | B2* | 1/2018 | Edwards | H01F 27/06 |
| 2011/0095847 | A1* | 4/2011 | Chen | H01F 17/062 333/175 |
| 2013/0194766 | A1* | 8/2013 | Chen | H01F 27/027 361/782 |
| 2014/0036459 | A1* | 2/2014 | Gutierrez | H01F 27/027 361/752 |
| 2014/0254094 | A1* | 9/2014 | Chang | H01F 27/2828 361/692 |

\* cited by examiner

MANUFACTURING METHOD OF A FILTER STRUCTURE

CROSS-REFERENCE TO RELATED APPLICATIONS

This present invention claims the benefit of Chinese Patent Application No. 201710103487.X, filed on Feb. 24, 2017; the contents of which are hereby incorporated by reference.

FIELD OF INVENTION

The present invention relates to a filter structure, a welding fixture, and a manufacturing method of the filter structure.

BACKGROUND OF INVENTION

1. Description of the Related Art

As computer and communication technologies advance, network are used more and more, and filters are important components with good anti-interference ability and capable of ensuring the transmission of information via network, so that the filters are used extensively in network systems, and a conventional network box has a plurality of coils installed in a cavity of a base, and a conductive wire and a pin connected by manual winding, so that the conventional network box has the drawbacks of wrong winding position, long manufacturing cycle, and low production efficiency.

2. Summary of the Invention

In view of the aforementioned drawbacks, it is a primary objective of the present invention to provide to a filter structure, a welding fixture, and a manufacturing method of the filter structure to overcome the drawbacks of the prior art.

To achieve the aforementioned and other objectives, the present invention provides a filter structure, comprising: a box, having a cavity; a plurality of coil components, installed in the cavity; and a plurality of wiring components, each having a positive wiring pin and a negative wiring pin fixed to the box; wherein the conductive wire has conductive wires coupled to both ends of the coil component and welded and fixed to the positive wiring pin and the negative wiring pin respectively.

Further, the coil component includes two winding part serially connected to each other, and each winding part includes a hollow magnetic ring, and a conductive wire is wound around the magnetic ring, and the center axis of the magnetic ring is configured vertically.

Further, the box has a plurality of wire latch slots formed and disposed equidistantly on both sides of the box, and the positive wiring pin and the negative wiring pin are embedded into lateral sides of the wire latch slot of the box respectively, and the positive wiring pin includes a wiring section, and a connecting section, and an end portion of the wiring section is disposed in the wire latch slot, and the conductive wire at an input end of the coil component is welded and fixed to the wiring section, and the connecting section is extended to the outer side of the box.

Further, the wiring section is bent into a hook shape for facilitating the wiring section to be embedded into the wire latch slot of the box.

Further, the connecting section has a head portion tilted and bent to facilitate the wiring section to be embedded into the wire latch slot of the box.

Further, the connecting section has a rear portion bent downwardly and then horizontally.

Further, the box further includes a wire input slot formed on a side of the cavity and communicated with the wire latch slot, and the conductive wire is passed through the wire input slot and extended to and latched tightly with the wire latch slot.

To achieve the aforementioned and other objectives, the present invention also provides a welding fixture for welding with the filter structure, and the welding fixture comprises a main body; the main body comprises sequentially arranged from the inside to the outside a chamber, a protruding portion, a welding slot for passing through a welding electrode of a spot welding machine, and a latch slot; and when the conductive wire of the filter structure is welded to the positive wiring pin or the negative wiring pin, the coil component is accommodated in the chamber, and the conductive wire passes through the protruding portion and the welding slot and latched tightly into the latch slot, and the protruding portion presses the conductive wire, so that the conductive wire is contacted with an end of the positive wiring pin or the negative wiring pin.

To achieve the aforementioned and other objectives, the present invention also provides a manufacturing method of the filter structure for manufacturing the aforementioned filter structure, and the manufacturing method comprises the following steps:

A. Embed a plurality of wiring components into both sides of the box respectively.

B. Install a coil component into a chamber of a welding fixture, and latch the conductive wires at both ends of the coil component into a latch slot of the welding fixture tightly.

C. Install the welding fixture to the top of the box, and press the conductive wire by the protruding portion, so that the conductive wire is contacted with the positive wiring pin or the negative wiring pin.

D. Use a spot welding machine to sequentially weld the conductive wire and the positive wiring pin or the negative wiring pin.

E. Package the filter structure.

Further, each of the positive wiring pin and the negative wiring pin has a connecting plate installed at the rear end thereof, and the step D further comprises the following steps:

D1. Connect a negative electric level of the spot welding machine to the connecting plate.

D2. Pass a positive electrode of the spot welding machine through the welding slot of the welding fixture and electrically connect the positive electrode of the spot welding machine to the conductive wire, so that the spot welding machine can weld and fix the conductive wires at both ends of the coil component with the positive wiring pin and the negative wiring pin respectively.

D3. Bend the positive and negative wiring pins of the wiring component downwardly and then horizontally.

D4. Cut off the connecting plates at the rear ends of the positive and negative wiring pins respectively.

Compared with the prior art, the filter structure of the present invention embeds the wiring section of the pin into a side of the wire latch slot and latches the conductive wire into the wire latch slot before welding and fixing the pins by spot welding, so that it is not necessary to manually wind the conductive wire and the pin, so as to achieve the effects of reducing labor, expediting the assembling process, improving production efficiency, shortening the length of the conductive wire, and lowering costs.

In the welding fixture of the present invention, the protruding portion presses the conductive wire into the wire latch slot after the coil component is pre-installed to the welding fixture, so that the conductive wire is contacted with an end of the wiring pin to facilitate the spot welding machine to weld the conductive wire to the pins quickly.

In the manufacturing of the filter structure in accordance with the present invention, each of the positive and negative wiring pins ahs a connecting plate, so that the pins can be embedded as a whole by the aforementioned welding fixture to achieve the effects of simplifying the process of spot welding the conductive wire to the pins, saving the manufacturing time, and improving the production efficiency.

The above and other objects, features and advantages of this disclosure will become apparent from the following detailed description taken with the accompanying drawings.

DESCRIPTION OF THE PREFERRED EMBODIMENTS

The invention discloses a filter structure comprising: a box having a cavity; a plurality of coil components installed in the cavity; and a plurality of wiring components. Each wiring component has a positive wiring pin and a negative wiring pin fixed to the box; wherein the conductive wire has conductive wires coupled to both ends of the coil component and welded and fixed to the positive and negative wiring pins respectively by spot welding or melting.

Figure 1:
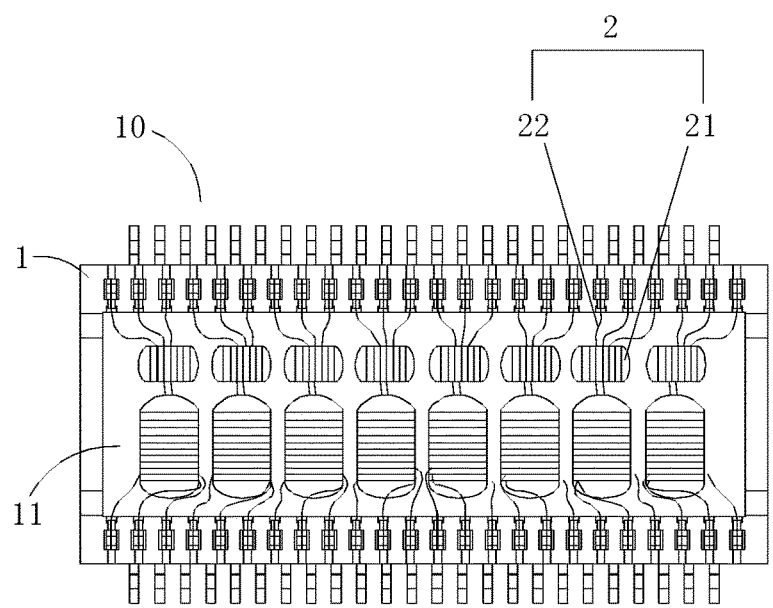
FIG. 1 is a top view showing the internal structure of a filter structure of the present invention.
Figure 2:
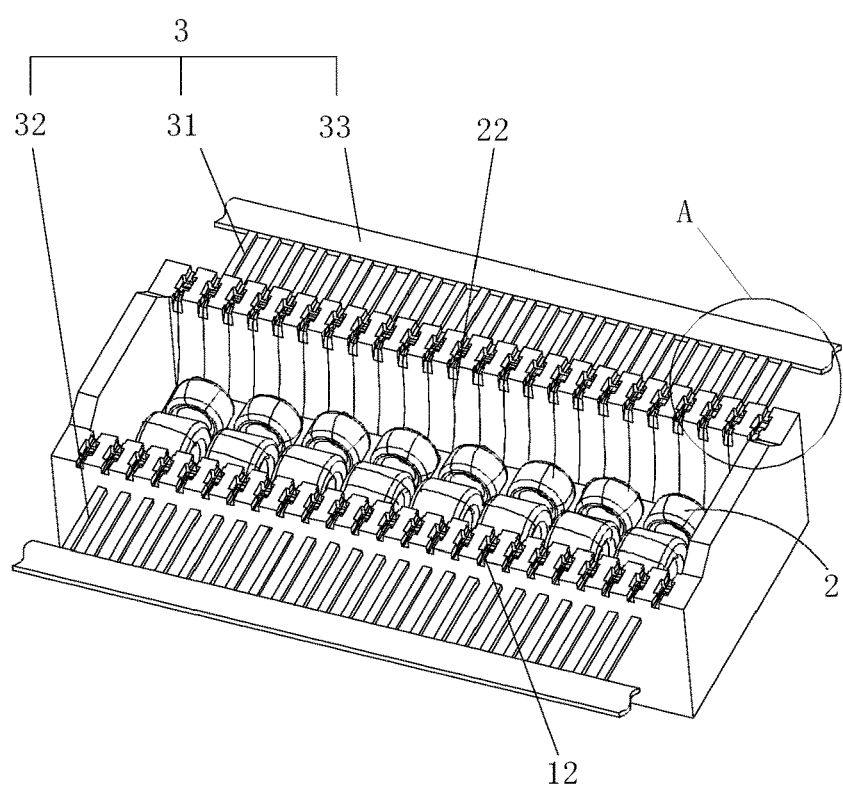
FIG. 2 is a perspective view showing the internal structure of a filter structure of the present invention.
Figure 3:
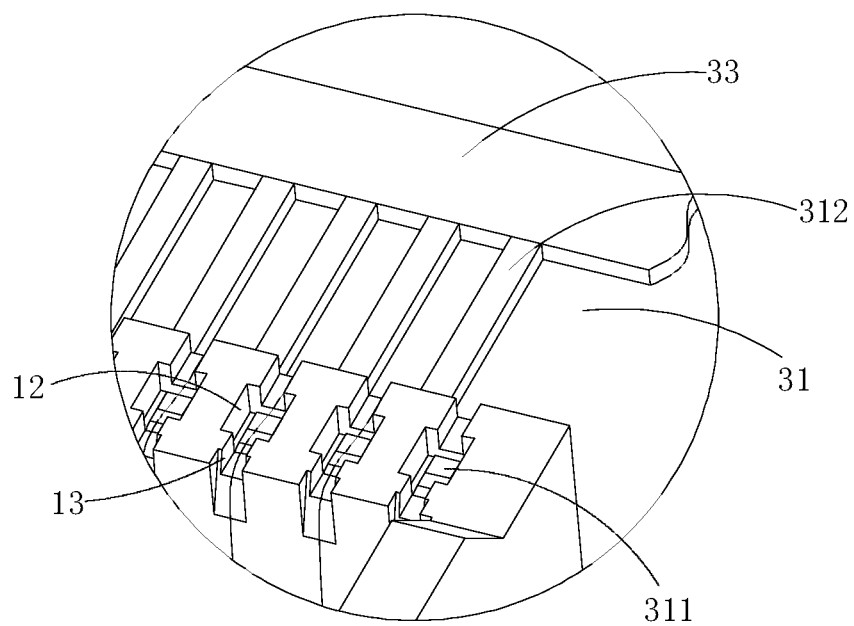
FIG. 3 is a blowup view of Section A of FIG. 2.

With reference to FIGS. 1, 2, and 3 for a filter structure 10 in accordance with the present invention, the filter structure 10 comprises a box 1 having a cavity 11, and a coil component 2 and a wiring component 3 installed in the cavity 11. Specifically, there are eight groups of coil components 2, and 24 groups of wiring components 3, and each group of coil components 2 has three conductive wires 22.

The wiring component 3 includes a positive wiring pin 31 and a negative wiring pin 32 fixed to the box 1, and conductive wires 22 at both ends of the coil component 2 fixed to the positive and negative wiring pins 31, 32 respectively by spot welding.

The coil component 2 includes two winding parts serially connected to each other, and the winding part includes a hollow magnetic ring 21, and a conductive wire 22 wound around the magnetic ring 21, wherein the center axis of the magnetic rings 21 of the two coils is configured vertically.

The box 1 has a plurality of wire latch slots 12 arranged equidistantly with one another, wherein the box 1 is made of an insulating plastic material. The positive wiring pin 31 and the negative wiring pin 32 are embedded into the lateral sides of the wire latch slot 12 of the box 1 respectively.

Figure 4:
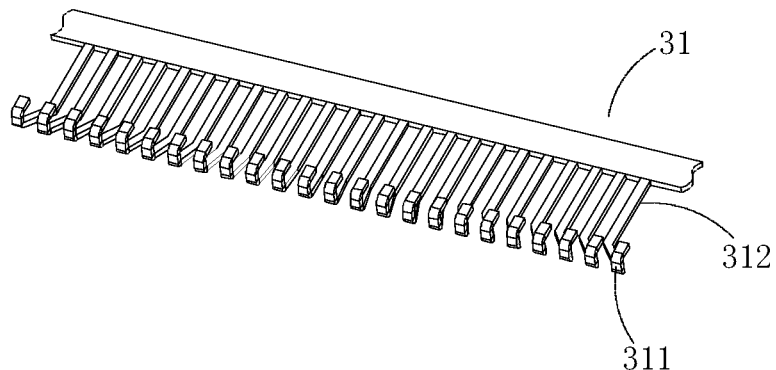
FIG. 4 is a perspective view of a positive wiring pin of the present invention.
Figure 5:
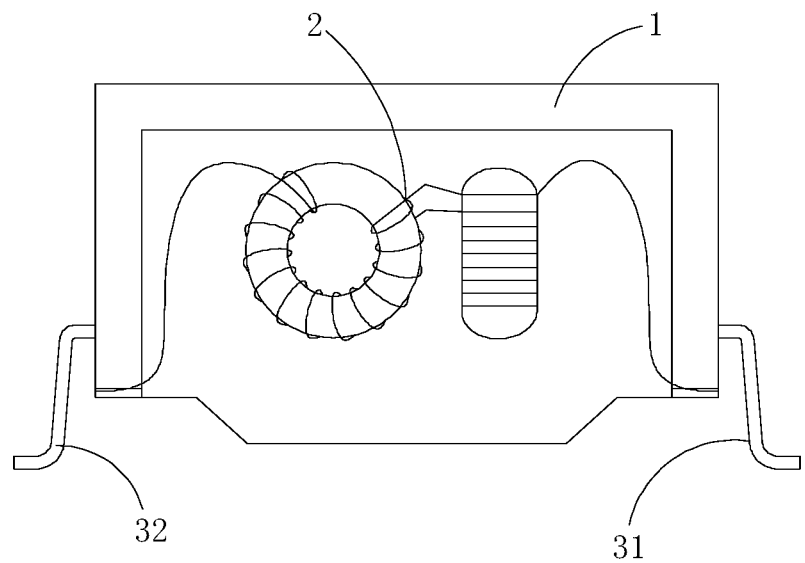
FIG. 5 is a sectional view of a filter structure of the present invention.

In FIGS. 4 and 5, the positive wiring pin 31 includes a wiring section 311 and a connecting section 312. The positive wiring pin 31 and the negative wiring pin 32 have the same structure. An end of the wiring section 311 is disposed in the wire latch slot 12, and the conductive wire at the input end of the coil component 2 is welded and fixed to the wiring section 311 by spot welding, and the connecting section 312 is extended to the outer side of the box 1.

The box 1 further comprises a wire input slot 12 formed on a side of the cavity 11 and communicated to the wire latch slot 12, and the conductive wire 22 is passed through the wire input slot 13 and extended to and latched tightly with the wire latch slot 12. Before the conductive wires 22 are welded to the positive wiring pin 31 and the negative wiring pin 32, the conductive wire 22 is latched and connected to the wire latch slot 12 to facilitate positioning the conductive wire 22 for future spot welding. During the assembling process, the wire input slot 13 is provide for guiding the conductive wire 22 of the coil component 2 to the wire latch slot 12.

After the wiring section 311 is bent into the hook shape, the head portion of the connecting section 312 is bent obliquely to facilitate embedding the wiring section 311 into the wire latch slot 12 of the box 1. Specifically, the wire latch slots 12 formed on both sides of the box 1 are arranged equidistantly from one another in order to provide a compact structure of the filter structure 10 and facilitate the automated production. Therefore, the head portion of the connecting section 312 is tilted to facilitate installing an end of the wiring section 311 into the wire latch slot 12.

The end of the wiring component 3 has a connecting plate 33 for fixing the positive wiring pin 31. In the production process, the positive wiring pin 31 and the connecting plate 33 are manufactured integrally with each other, and the head portion of the positive wiring pin 31 is bent obliquely and then further bent into a hook shape.

The rear portion of the connecting section 312 is bent downwardly and then horizontally. After the assembling process is completed, the connecting plates 33 at the rear ends of the positive wiring pin 31 and the negative wiring pin 32 are cut off.

Figure 6:
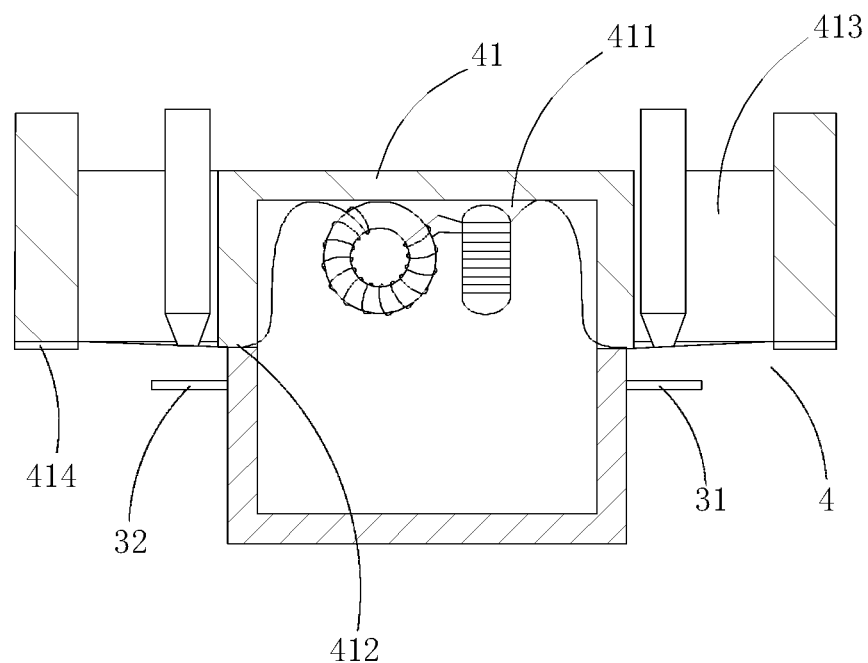
FIG. 6 is a cross-sectional view of a welding fixture situated in a welding status in accordance with the present invention.

With reference to FIG. 6 for a welding fixture 4 in accordance with the present invention, the welding fixture 4 is used for welding the aforementioned filter structure 10. The welding fixture 4 comprises a main body 41. Arranged sequentially from the inside to the outside, the main body 41 comprises a chamber 411, a protruding portion 412, a welding slot 413 for passing an electrode 5 of a spot welding machine, and a latch slot 414. When the conductive wire of the filter structure 10 is welded with the positive wiring pin 31 or the negative wiring pin 32, the coil component 2 is accommodated in the chamber 411, and the conductive wire is passed through the protruding portion 412, and the welding slot 413 is latched into the latch slot 414, and the protruding portion 412 presses the conductive wire 22, so that the conductive wire is contacted with an end of the positive wiring pin 31 or the negative wiring pin 32.

Figure 7:
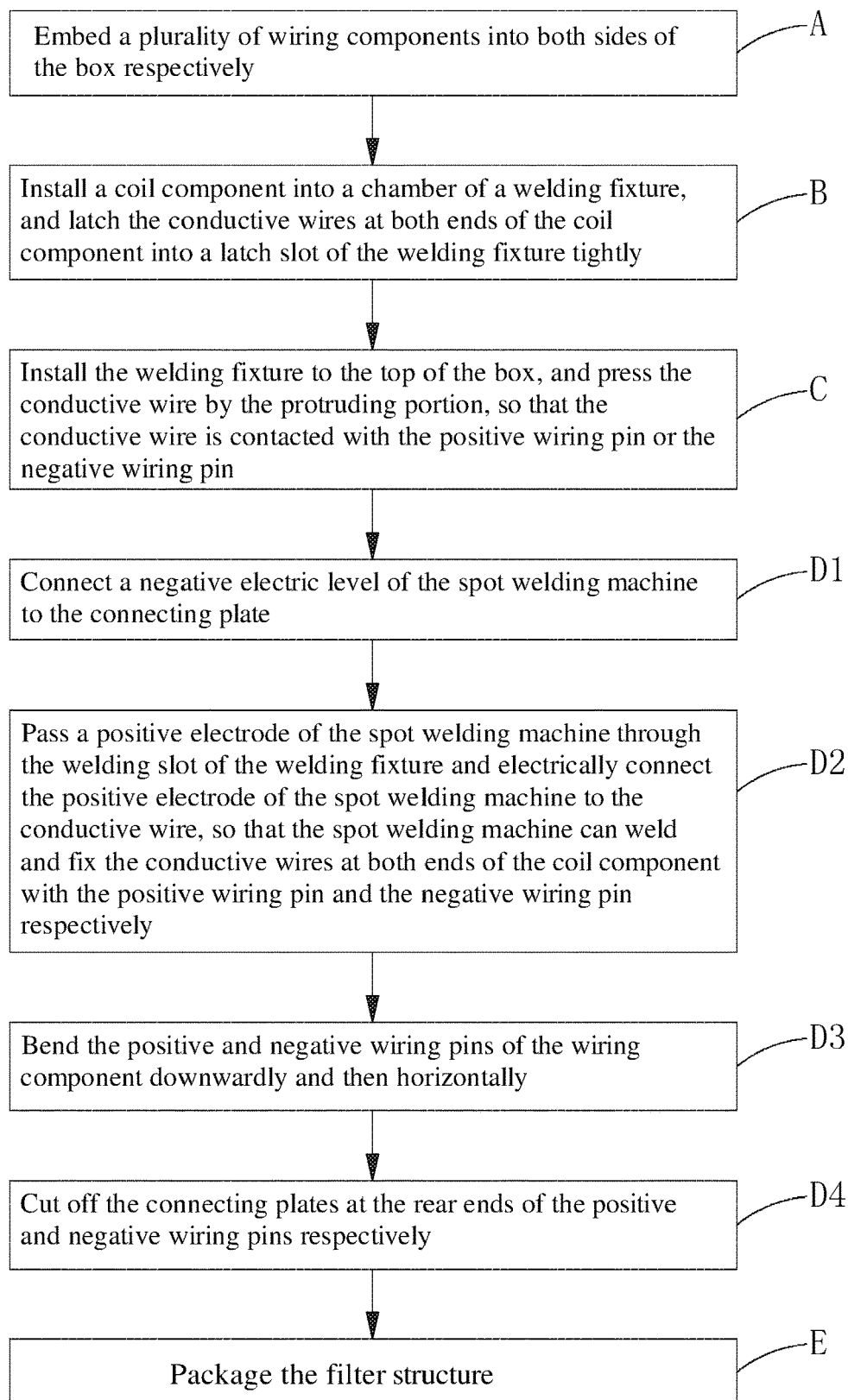
FIG. 7 is a flow chart of a manufacturing method of a filter structure in accordance with the present invention.

With reference to FIG. 7 for a manufacturing method of a filter structure in accordance with the present invention, the method is used for manufacturing the aforementioned filter structure and comprises the following steps:

A. Embed a plurality of wiring components into both sides of the box respectively.

B. Install a coil component into a chamber of a welding fixture, and latch the conductive wires at both ends of the coil component into a latch slot of the welding fixture tightly.

C. Install the welding fixture to the top of the box, and press the conductive wire by the protruding portion, so that the conductive wire is contacted with the positive wiring pin or the negative wiring pin. Specifically, the protruding portion presses the conductive wire into the wire latch slot of the box.

D. Use a spot welding machine to sequentially weld the conductive wire and the positive wiring pin or the negative wiring pin. Wherein, each of the positive and negative wiring pins has a connecting plate installed at the rear end thereof, and the step D further comprises the following steps:

D1. Connect a negative electric level of the spot welding machine to the connecting plate.

D2. Pass a positive electrode of the spot welding machine through the welding slot of the welding fixture and electrically connect the positive electrode of the spot welding machine to the conductive wire, so that the spot welding machine can weld and fix the conductive wires at both ends of the coil component with the positive and negative wiring pins respectively.

D3. Bend the positive and negative wiring pins of the wiring component downwardly and then horizontally.

D4. Cut off the connecting plates at the rear ends of the positive and negative wiring pins respectively.

E. Package the filter structure.

Before the step A takes place, the manufacturing method further comprises the steps of manufacturing positive and negative wiring pins, and a plastic box with a cavity, wherein the rear end of each of the positive and negative wiring pins has a connecting plate fixed to the positive wiring pin, and bending the head portions of the positive and negative wiring pins obliquely and then further bending the head portions of the positive and negative wiring pins into a hook shape.

While the invention has been described by means of specific embodiments, numerous modifications and variations could be made thereto by those skilled in the art without departing from the scope and spirit of the invention set forth in the claims.

What is claimed is:

1. A manufacturing method of a filter structure, the filter structure comprising:
a box, having a cavity;
a plurality of coil components, installed in the cavity; and
a plurality of wiring components, each having a positive wiring pin and a negative wiring pin fixed to the box;
conductive wires coupled to both ends of each coil component being welded and fixed to the positive wiring pin and the negative wiring pin respectively,
wherein the manufacturing method comprises the steps of:
(A) embedding a plurality of wiring components into both sides of the box respectively;
(B) installing a coil component into a chamber of a welding fixture, and latching the conductive wires at both ends of the coil component into a latch slot of the welding fixture tightly;
(C) installing a welding fixture to a top of the box, pressing the conductive wire by a protruding portion, so that the conductive wire is contacted with the positive wiring pin or the negative wiring pin;
(D) using a spot welding machine to sequentially weld the conductive wire and the positive wiring pin or the negative wiring pin; and
(E) packaging the filter structure.

2. The manufacturing method of a filter structure according to claim 1, wherein each of the positive and negative wiring pins has a connecting plate installed at the rear end thereof, and the step D further comprises the steps of:
(D1) connecting a negative electric level of the spot welding machine to the connecting plate;
(D2) passing a positive electrode of the spot welding machine through the welding slot of the welding fixture and electrically coupled to the conductive wire, so that the spot welding machine can weld and fix the conductive wires at both ends of the coil component with the positive wiring pin and the negative wiring pin respectively;
(D3) bending the positive and negative wiring pins of the wiring component downwardly and then bending the positive and negative wiring pins of the wiring component horizontally; and
(D4) cutting off the connecting plates at the rear ends of the positive and negative wiring pins respectively.

\* \* \* \* \*